United States Patent
Wang et al.

(10) Patent No.: US 11,508,329 B2
(45) Date of Patent: Nov. 22, 2022

(54) COLOR CONTROL METHOD AND APPARATUS OF A TO-BE-DISPLAYED OBJECT, MEASUREMENT DEVICE, AND MEDIUM

(71) Applicant: RIGOL TECHNOLOGIES, INC., Beijing (CN)

(72) Inventors: Hao Wang, Jiangsu (CN); Yue Wang, Jiangsu (CN); Tieiun Wang, Jiangsu (CN); Weisen Li, Jiangsu (CN)

(73) Assignee: RIGOL TECHNOLOGIES, INC., Beijing (CN)

( * ) Notice: Subject to any disclaimer, the term of this patent is extended or adjusted under 35 U.S.C. 154(b) by 0 days.

(21) Appl. No.: 17/275,831

(22) PCT Filed: May 22, 2020

(86) PCT No.: PCT/CN2020/091859
§ 371 (c)(1),
(2) Date: Mar. 12, 2021

(87) PCT Pub. No.: WO2021/120519
PCT Pub. Date: Jun. 24, 2021

(65) Prior Publication Data
US 2022/0093058 A1 Mar. 24, 2022

(30) Foreign Application Priority Data
Dec. 19, 2019 (CN) .......................... 201911318522.5

(51) Int. Cl.
*G06F 9/451* (2018.01)
*G09G 5/02* (2006.01)
(Continued)

(52) U.S. Cl.
CPC ........... *G09G 5/02* (2013.01); *G01R 13/0227* (2013.01); *G09G 2320/0666* (2013.01)

(58) Field of Classification Search
CPC .... G09G 5/02; G09G 5/06; G09G 2320/0271; G09G 2320/0276; G09G 2320/06;
(Continued)

(56) References Cited

U.S. PATENT DOCUMENTS 6,229,536 B1   5/2001  Alexander et al.
9,087,274 B2 * 7/2015  Kawabata ................ H04N 1/60
(Continued)

FOREIGN PATENT DOCUMENTS

CN    101726643       6/2010
CN    102750924 A    10/2012
(Continued)

OTHER PUBLICATIONS

Unknown, "International Search Report", International Application No. PCT/CN2020/091859, dated Sep. 21, 2020, 5 pages.
(Continued)

*Primary Examiner* — Wesner Sajous

(57) ABSTRACT

Provided are a color control method and apparatus of a to-be-displayed object, a measurement device, and a medium. The method includes: acquiring to-be-displayed object information of the to-be-displayed object, and generating a corresponding to-be-displayed object interface according to the to-be-displayed object information; configuring color information of the to-be-displayed object interface based on a preset to-be-displayed object color mapping frame, where the to-be-displayed object color mapping frame is used for configuring a mapping relationship between the color information and the to-be-displayed object information of the to-be-displayed object on a current display interface; and displaying the to-be-displayed object information of the to-be-displayed object interface according to the configured color information.

11 Claims, 10 Drawing Sheets

(51) Int. Cl.
*G09G 5/06* (2006.01)
*G06T 7/90* (2017.01)
*G06T 11/00* (2006.01)
*H04N 1/60* (2006.01)
*G01R 13/02* (2006.01)

(58) Field of Classification Search
CPC ....... G09G 2320/0666; G09G 2320/02; G09G 5/04; G09G 5/10; G09G 5/24; G09G 5/30; G09G 5/32; G09G 5/37; G09G 5/377; G09G 5/38; G09G 2320/0233; G09G 2320/0238; G09G 2320/0242; G09G 2320/04; G09G 2320/041; G09G 2320/043; G09G 2320/0606; G09G 2320/062; G09G 2320/0626; G09G 2320/066; G09G 2320/0693; G09G 2320/10; G09G 2320/103; G09G 2320/106; G09G 2340/0407; G09G 2340/0464; G09G 2340/06; G09G 2340/10; G09G 2340/12; G09G 2340/14; G09G 2360/14; G09G 2360/144; G09G 2360/16; G09G 2330/12; G06F 9/451; G06F 3/048; G06F 3/0481; G06F 3/0482; G06F 3/0484; G06F 3/04845; G06F 3/04847; G01D 7/005; G01D 18/00; G01R 13/0227; G01R 13/00; G01R 13/02; G01R 13/0236; G01R 13/26; G01R 13/28; G01R 13/34; H04N 17/02; H04N 13/133; H04N 13/15; H04N 13/183; H04N 9/64; H04N 9/69; H04N 9/73; H04N 9/74; H04N 9/77; H04N 9/3182; H04N 9/00; H04N 9/04521; H04N 5/57; H04N 1/60; H04N 1/6037; H04N 1/6033; H04N 1/6041; G06T 7/90; G06T 11/001; G06T 11/40; G06T 11/60; G06T 15/50; G06T 2207/10024
USPC .......................................................... 345/589
See application file for complete search history.

(56) References Cited

U.S. PATENT DOCUMENTS

| | | |
|---|---|---|
| 9,792,878 B2 | 10/2017 | Yoon et al. |
| 2005/0071104 A1* | 3/2005 | Viturro .............. H04N 1/00015 702/85 |
| 2013/0100154 A1 | 4/2013 | Woodings et al. |
| 2015/0278646 A1* | 10/2015 | Kawabata ........... H04N 1/6047 358/1.9 |
| 2018/0300579 A1 | 10/2018 | Tojo |
| 2018/0360308 A1* | 12/2018 | Aimi ....................... G06T 19/20 |
| 2021/0004996 A1* | 1/2021 | Murillo ................. G06T 11/001 |

FOREIGN PATENT DOCUMENTS

| | | | |
|---|---|---|---|
| CN | 201110363041 | 10/2012 | |
| CN | 109725198 | 5/2019 | |
| JP | 10305035 A | 11/1998 | |
| JP | 2651112 A1 * | 12/2011 | .............. H04N 1/60 |
| WO | 2005122906 A1 | 12/2005 | |

OTHER PUBLICATIONS

European Communication with Search Report dated May 2, 2022 in connection with European Application No. 20859654.4, 7 pages.
Japanese Office Action dated Apr. 21, 2022 in connection with Japanese Application No. 2021-514615, 5 pages.
English language translation of Japanese Office Action dated Apr. 21, 2022 in connection with Japanese Application No. 2021-514615, 5 pages.

* cited by examiner

COLOR CONTROL METHOD AND APPARATUS OF A TO-BE-DISPLAYED OBJECT, MEASUREMENT DEVICE, AND MEDIUM

CROSS REFERENCE TO RELATED APPLICATION

This is a National Stage Application filed under 35 U.S.C. 371 based on International Patent Application No. PCT/CN2020/091859, filed on May 22, 2020, which claims priority to Chinese Patent Application No. 201911318522.5 filed on Dec. 19, 2019, the disclosures of both of which are incorporated herein by reference in their entireties. This application claims priority to Chinese Patent Application No. 201911318522.5 filed with the CNIPA Dec. 19, 2019, the disclosure of which is incorporated herein by reference in its entirety.

TECHNICAL FIELD

Embodiments of the present application relate to the technical field of measurement instruments and, for example, relate to a color control method and apparatus of a to-be-displayed object, a measurement device, and a medium.

BACKGROUND

With the development of technologies, requirements of users for display screens become increasing, the number of channels of a test instrument is also increasing, and the number of the types of waveforms keeps growing, but configuration of colors of these instruments is obviously limited. For the display of the test instrument, the brightness or color configuration of a to-be-displayed object is determined through a relationship between the brightness or color of the to-be-displayed object that needs to be displayed on the screen and some amount of information of the to-be-displayed object.

For example, in an oscilloscope, the brightness of a to-be-displayed object is related to probability information about hitting pixel points correspondingly by the to-be-displayed object, and in a spectrometer, the brightness of a to-be-displayed object of spectral data is related to the amount of signals that appears at the current frequency within a period of time. In the related art, the display color or brightness of the to-be-displayed object is controlled by a predetermined mapping relationship.

SUMMARY

The embodiments of the present application provide a color control method and apparatus of a to-be-displayed object, a measurement device, and a medium, so that color information displayed by the to-be-displayed object can be freely selected and a mapping relationship between the selected color information and to-be-displayed object information can be displayed in real-time in a display interface, thereby facilitating the user operation and improving the user experience.

In a first aspect, an embodiment of the present application provides a color control method of a to-be-displayed object. The method includes steps described below.

To-be-displayed object information of the to-be-displayed object is acquired, and a corresponding to-be-displayed object interface is generated according to the to-be-displayed object information; color information of the to-be-displayed object interface is configured based on a preset to-be-displayed object color mapping frame, where the to-be-displayed object color mapping frame is used for configuring a mapping relationship between the color information and the to-be-displayed object information of the to-be-displayed object on a current display interface; and the to-be-displayed object information of the to-be-displayed object interface is displayed according to the configured color information.

In a second aspect, an embodiment of the present application further provides a color control apparatus of a to-be-displayed object. The apparatus includes an interface generation module, a color configuration module and an interface display module. The interface generation module is configured to acquire to-be-displayed object information of the to-be-displayed object, and generate a corresponding to-be-displayed object interface according to the to-be-displayed object information. The color configuration module is configured to configure color information of the to-be-displayed object interface based on a preset to-be-displayed object color mapping frame, where the to-be-displayed object color mapping frame is used for configuring a mapping relationship between the color information and the to-be-displayed object information of the to-be-displayed object on a current display interface. The interface display module is configured to display the to-be-displayed object information of the to-be-displayed object interface according to the configured color information.

In a third aspect, the present application further provides a measurement device. The measurement device includes: at least one processor and a storage device which is configured to store multiple programs. At least one of the multiple programs, when executed by the at least one processor, causes the at least one processor to implement the color control method of the to-be-displayed object provided in the first aspect of the present application.

In a fourth aspect, the present application further provides a computer-readable storage medium. The computer-readable storage medium is configured to store a computer program, where the computer program, when executed by a processor, implements the color control method of the to-be-displayed object provided in the first aspect of the present application.

DETAILED DESCRIPTION

Figure 1A:
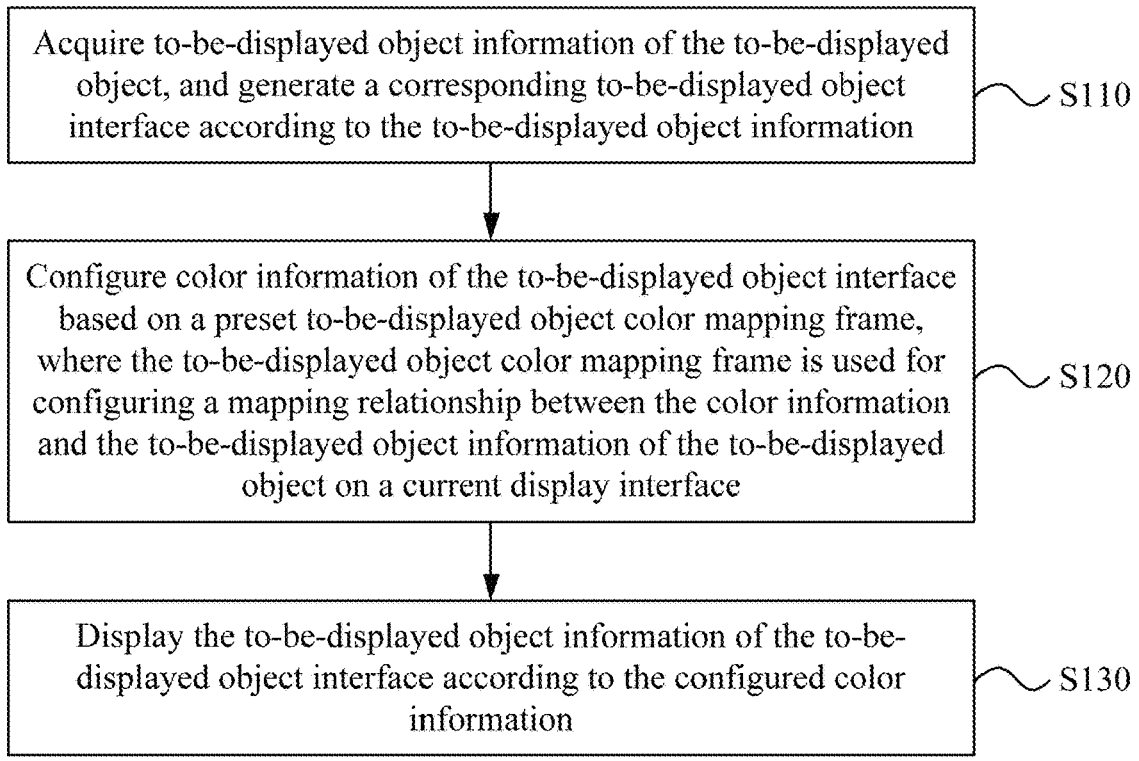
FIG. 1A is a flowchart of a color control method of a to-be-displayed object according to an embodiment of the present application.

It is to be noted that for ease of description, only part, not all, of the content related to the present application is illustrated in the drawings. Before the exemplary embodiments are discussed in more detail, it is to be noted that some of the exemplary embodiments are described as processing or methods depicted in flowcharts. Although a flowchart describes the operations (or steps) as a sequential process, many of the operations can be performed in parallel, coincidently or simultaneously. Additionally, the sequence of the operations can be rearranged. The processing can be terminated when the operations are completed, but the processing can further have additional steps which are not included in the drawings. The processing can correspond to a method, a function, a procedure, a subroutine, a subprogram, etc.

FIG. 1A is a flowchart of a color control method of a to-be-displayed object according to an embodiment of the present application. This embodiment may be applicable to a display device which may be a measurement device, in particular, applicable to a case where a to-be-displayed object of the measurement device and the color information displayed by the to-be-displayed object are freely set. The method may be performed by a color control apparatus of the to-be-displayed object, and the apparatus may be implemented in at least one of software or hardware. The method includes steps S110 to S130 described below.

In step S110, to-be-displayed object information of the to-be-displayed object is acquired, and a corresponding to-be-displayed object interface is generated according to the to-be-displayed object information.

The to-be-displayed object may be a waveform or measurement trace outputted by the measurement device. The measurement device refers to a device having a display screen, and such a device includes a display device in the conventional sense such as a personal computer, and also includes a measurement device having a display screen, where such a measurement device refers to an instrument that converts measurement into indication values that can be directly observed, including various types of indicating instruments, recording instruments, analytical instruments or the like, such as spectrum analyzers or oscilloscopes. Exemplarily, the to-be-displayed object may be a waveform outputted by an oscilloscope, or may be a measurement trace of a signal in a spectrum analyzer. In this embodiment, the measurement trace may be a density trace measurement in a frequency domain bitmap on a current test interface.

The to-be-displayed object information refers to specific information corresponding to the to-be-displayed object, such as waveform probability information of the oscilloscope, level information, a power spectral density identification of the signal in the spectrometer, and so on.

The to-be-displayed object interface refers an interface which is provided for the user and contains color combinations related to display parameters of the screen of the measurement device on the display interface of the measurement device, and the interface contains all colors and brightness ranges capable of being displayed by the screen of the measurement device. The to-be-displayed interface is used for displaying the to-be-displayed object when the to-be-displayed object is outputted. The to-be-displayed interface is disposed on the display screen of the measurement device and is in an independent display layer.

Exemplarily, before the display color of the to-be-displayed object is controlled, the to-be-displayed object information of the to-be-displayed object is acquired, and it is determined that the to-be-displayed object information that needs to be controlled can match the color information, so that the to-be-displayed object information can be distinguished through the display of different colors.

It is to be understood that after the to-be-displayed object information is determined, a to-be-displayed object interface which is to be used may be generated for displaying the to-be-displayed information of the to-be-displayed object in the to-be-displayed object interface.

Exemplarily, the waveform probability information of the oscilloscope is used as an example. Waveform characteristic information of the to-be-displayed waveform is acquired, and a corresponding waveform display interface is generated according to the waveform characteristic information.

In step S120, color information of the to-be-displayed object interface is configured based on a preset to-be-displayed object color mapping frame, where the to-be-displayed object color mapping frame is used for configuring a mapping relationship between the color information and the to-be-displayed object information of the to-be-displayed object on a current display interface.

The to-be-displayed object color mapping frame refers to a "to-be-displayed object information and color" mapping function frame provided by the measurement device for the user. The waveform information of the oscilloscope is used as an example. If the user selects the waveform probability information as the waveform information of the oscilloscope, a "probability-color" mapping function frame may be selected on the oscilloscope, and if the user selects waveform level amplitude information as the waveform information of the oscilloscope, a "level amplitude-color" mapping function frame may be selected on the oscilloscope. When the measurement device performs high-speed acquisition, the waveform picture displayed on the screen in fact is formed by multiple superimposed waveforms, and the superimposed parts with high occurrence probability are displayed brighter while the superimposed parts with low occurrence probability are displayed darker, so that the waveform information with different brightness is formed in the screen, i.e. the waveform probability information.

It is to be understood that the purpose of the to-be-displayed object color mapping frame is to correspond the to-be-displayed object information to the color information in real-time, and the to-be-displayed object color mapping frame may also be in various forms as long as the frame can be visually represented.

Figure 1B:
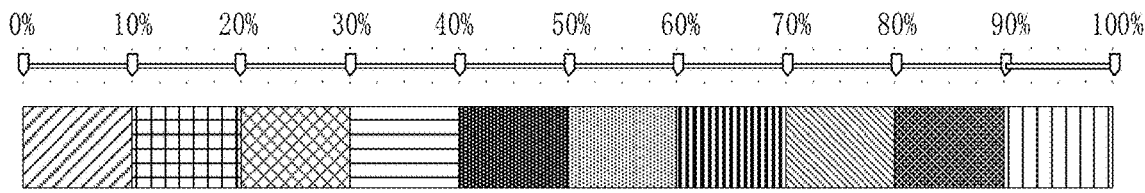
FIG. 1B is a schematic view of an exemplary mapping frame of waveform probability information and color information according to an embodiment of the present application.
Figure 1C:
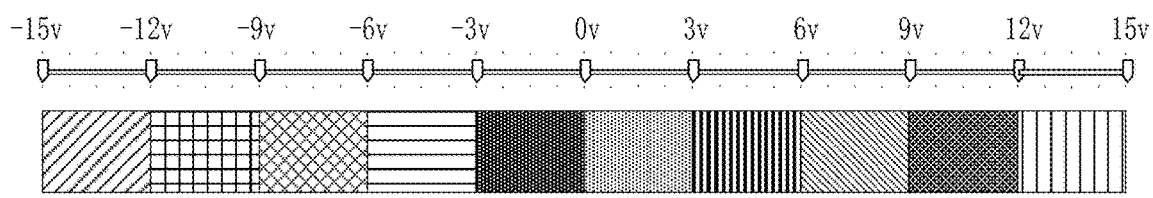
FIG. 1C is a schematic view of an exemplary mapping frame of level amplitude information of an oscilloscope and color information according to an embodiment of the present application.

Exemplarily, FIG. 1B is a schematic view of an exemplary mapping frame of waveform probability information and color information according to an embodiment of the present application. With reference to FIG. 1B, a mapping frame of waveform probability information of the oscilloscope and color information is used as an example. The waveform probability information and colors are uniformly distributed, that is, one interval of the waveform probability information corresponds to one color, and different intervals of the waveform probability information correspond to different colors. FIG. 1C is a schematic view of an exemplary mapping frame of level amplitude information of an oscilloscope and color information according to an embodiment of the present application, that is, one interval of the level amplitude corresponds to one color, and different intervals of the level amplitude correspond to different colors.

It is to be noted that the to-be-displayed object color mapping frame may be in the form of tables, images, diagrams and the like that express the mapping relationship between colors and certain parameters required to be represented.

Figure 1D:
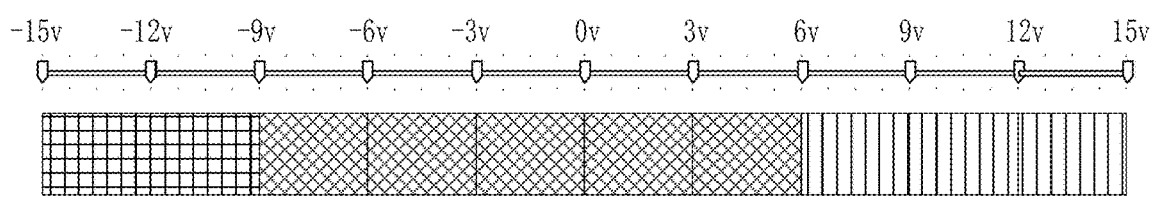
FIG. 1D is a schematic view of an exemplary to-be-displayed object color mapping frame according to an embodiment of the present application.

FIG. 1D is a schematic view of an exemplary to-be-displayed object color mapping frame according to an embodiment of the present application. With reference to FIG. 1D, the to-be-displayed object color mapping frame may be uniformly distributed or non-uniformly distributed. In this embodiment, the level amplitude information of the oscilloscope is displayed as color A in the amplitude from −15 v to −9 v and color B in the amplitude from −9 v to +6 v, and in a case where the amplitude is greater than 6 v, the waveform is displayed as color C. That is, the same waveform may be displayed in three different colors, and thus it can be visually seen the amplitude information of a waveform at a certain moment.

The color information may include a variety of colors in the related art, that is, it may include a sufficient number of colors. Meanwhile, the color information also needs to be adapted to hardware conditions of the display of the measurement device. Exemplarily, for the screen of a measurement device that supports 256 color scales, the color information is generally 8-bit monochrome information, and in a case where RGB (Red, Green, Blue) has 24-bit color information, up to $2^8*2^8*2^8=16777216$ colors can be distributed on the screen of the measurement device.

The color information can be selected in many different ways, for example, by using a color wheel, color disc, color ring, color rectangle fame and the like. Exemplarily, the color disc is used as an example. The color disc is a color circle where colors are arranged in order at 360 degrees according to the hue, and colors having different brightnesses in the same hue are generally increased from the center point to the circumference to form a regular color circle.

It is to be understood that the presentation form of the color information may also be other shapes, and this embodiment of the present application is only intended to explain and not be construed as limitation thereto. The selection of different presentation forms of the color information is to make it easy to select the color that meets the hardware display screen and complete the subsequent mapping operation.

Exemplarily, the to-be-displayed object color mapping frame is generated on the to-be-displayed object interface, and the mapping relationship between the color information and the to-be-displayed object information of the to-be-displayed object on the current display interface is configured, and the color information of the to-be-displayed object interface is configured based on the preset to-be-displayed object color mapping frame.

Additionally, it is to be noted that the to-be-displayed object color mapping frame having selected color is distributed uniformly and proportionally by default. For example, when four different colors are selected, the entire to-be-displayed object color mapping frame is formed in which each color occupies 25% of the frame. Additionally, the to-be-displayed object color mapping frame may also support the non-uniform distribution, and such a non-uniform adjustment may have two options, that is, intelligent recommended adjustment and manual non-uniform adjustment.

In step S130, the to-be-displayed object information of the to-be-displayed object interface is displayed according to the configured color information.

Exemplarily, after the color information is configured in the to-be-displayed object color mapping frame, the to-be-displayed object color mapping frame is correspondingly displayed on the to-be-displayed object interface. Meanwhile, the to-be-displayed object displays the to-be-displayed object information on the to-be-displayed object interface based on the mapping relationship, in the to-be-displayed object color mapping frame, between the to-be-displayed object information and colors.

In this embodiment of the present application, the to-be-displayed object information of the to-be-displayed object is acquired, and the corresponding to-be-displayed object interface is generated according to the to-be-displayed object information; the color information of the to-be-displayed object interface is configured based on the preset to-be-displayed object color mapping frame, where the to-be-displayed object color mapping frame is used for configuring the mapping relationship between the color information and the to-be-displayed object information of the to-be-displayed object on the current display interface; and the to-be-displayed object information of the to-be-displayed object interface is displayed according to the configured color information. Therefore, the situation in the related art in which the display color of the to-be-displayed object of the measurement device relies on the inherent device configuration and cannot be freely set can be avoided, and thus color information displayed by the to-be-displayed object can be freely selected and the mapping relationship between the selected color information and the to-be-displayed object can be displayed in real-time in the display interface, thereby facilitating the user operation and improving the user experience.

Figure 2A:
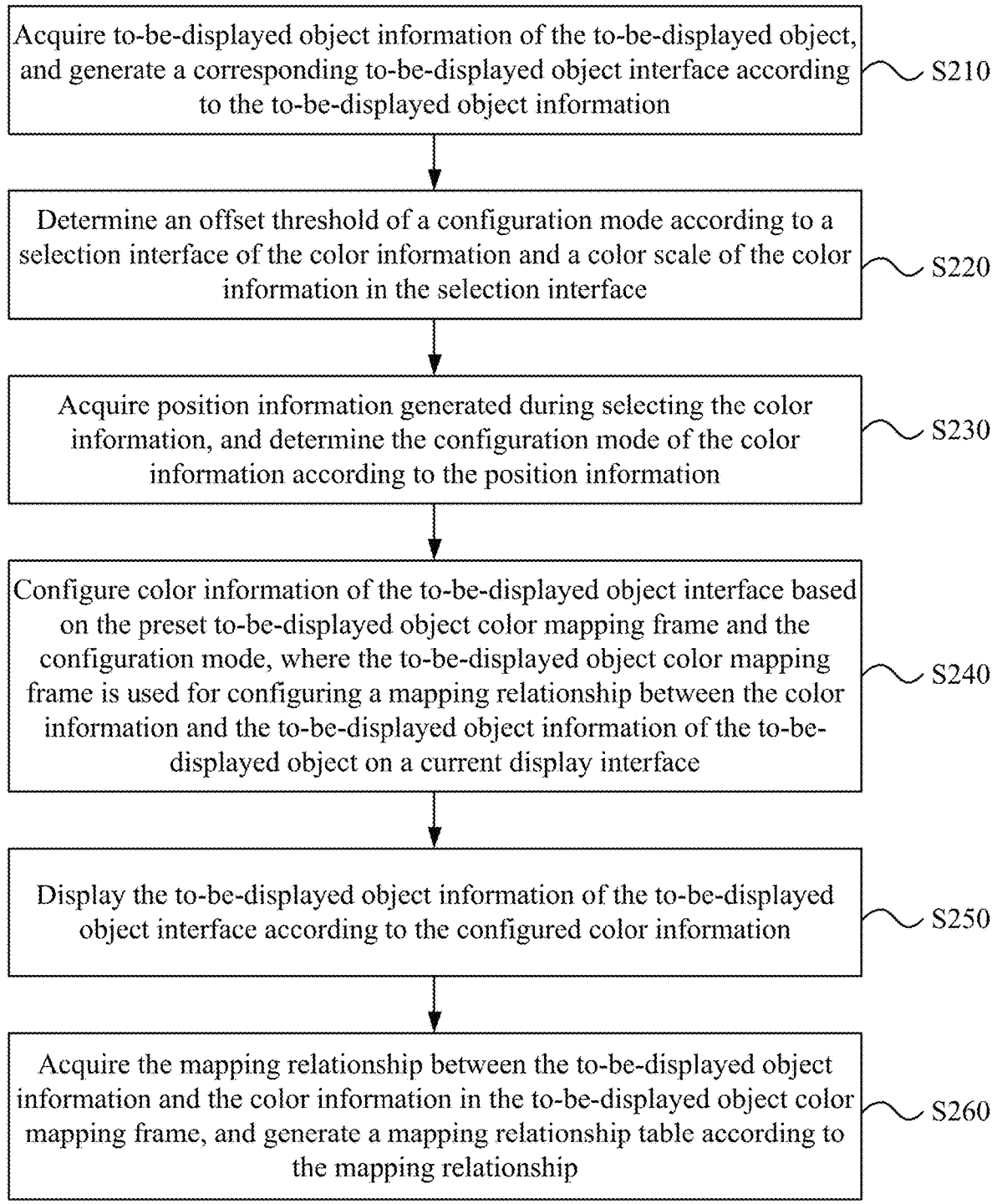
FIG. 2A is a flowchart of another color control method of a to-be-displayed object according to an embodiment of the present application.

FIG. 2A is a flowchart of another color control method of a to-be-displayed object according to an embodiment of the present application. This embodiment is refined based on the preceding embodiment.

The method of this embodiment includes steps S210 to S260.

In step S210, to-be-displayed object information of the to-be-displayed object is acquired, and a corresponding to-be-displayed object interface is generated according to the to-be-displayed object information.

In step S220, an offset threshold of a configuration mode is determined according to a selection interface of the color information and a color scale of the color information in the selection interface.

The selection interface of the color information is the presentation form for selecting the color, for example, by using a color wheel, color disc, color ring, color rectangle fame and the like.

The color scale is an index standard indicating the intensity of the image brightness. In this embodiment, the color scale of the color information in the selection interface is adapted to the hardware conditions of the display of the measurement device, that is, the configuration mode may be related to the range of brightness that the screen of the measurement device can display.

Exemplarily, using the selection interface of the color information being a color disc as an example, the radius of the color disc on the screen of the measurement device is denoted as L, and the color scale in the color disc is denoted as S, and thus the offset threshold of the configuration mode may be calculated by using the following formula.

The formula is as follows.

$$\text{Offset threshold} = L/2S*2$$

In step S230, position information generated during selecting the color information is acquired, and the configuration mode of the color information is determined according to the position information.

The step in which the position information generated during selecting the color information is acquired and the configuration mode of the color information is determined according to the position information includes the following steps: the position information generated during selecting the color information is acquired, and a position offset generated during selecting the color information is determined according to the position information; and the configuration mode of the color information is determined according to the position offset and the offset threshold.

For the measurement device, the color information may be selected by touching the screen of the measurement device with a user gesture or by using the mouse, or may be selected by performing other similar operations of selecting and confirming the color information displayed on the screen of the measurement device, which is not limited in the embodiment of the present application.

The position information generated during selecting the color information refers to a point generated on the selection interface of the color information, or the position or displacement of a track generated on the selection interface of the color information when the operation of selecting the color information is performed. Exemplarily, during selecting the color information, the starting point of the selection interface of the color information is set to A, a position offset is generated based on the movement from point A to point B, and the position offset is compared with the offset threshold to determine the configuration mode of the color information.

The step in which the configuration mode of the color information is determined according to the position offset and the offset threshold includes the following steps: it is determined whether the position offset is less than the offset threshold, and in response to the position offset being less than the offset threshold, it is determined that the configuration mode is a point configuration.

The step in which the configuration mode of the color information is determined according to the position offset and the offset threshold includes the following steps: it is determined whether the position offset is greater than the offset threshold, and in response to the position offset being greater than the offset threshold, it is determined that the configuration mode is a vector configuration.

The step in which the configuration mode of the color information is determined according to the position offset and the offset threshold includes the following steps: it is determined whether the position offset is equal to the offset threshold, and in response to the position offset being equal to the offset threshold, it is determined that the configuration mode is the point configuration or the vector configuration.

Exemplarily, in response to the position offset being less than the offset threshold, the configuration mode is the point configuration; in response to the position offset being greater than the offset threshold, the configuration mode is the vector configuration; and in response to the position offset being equal to the offset threshold, the configuration mode is the point configuration or the vector configuration.

Exemplarily, during selecting the color information, the movement of the mouse arrow or the movement of the point selected at the position corresponding to the finger in the operation of the gesture may be perceived on the screen of the measurement device. In a case where the distance moved (i.e., the position offset) is greater than the offset threshold, which indicates that more than one piece of color information is needed in a selection of the color information, the configuration mode of the color information is the vector configuration; and in a case where the distance moved (i.e., the position offset) is less than the offset threshold, which indicates that only one piece of color information is obtained in a selection of the color information, the configuration mode of the color information is the point configuration.

It is to be noted that in a case where the configuration mode of the color information is the point configuration, it is only required to configure the color information selected in the current selection interface of the color information to the to-be-displayed object color mapping frame; while in the case where the configuration mode of the color information is the vector configuration, it is required to determine all color information contained in the position movement track and configure all color information serving as a group of color information to the to-be-displayed color mapping frame.

Additionally, it is to be noted that in a case where the position offset is equal to the offset threshold, it is determined that the configuration mode is the point configuration or the vector configuration, those skilled in the art can select one of the two configurations according to actual requirements, and this embodiment is only intended to illustrate and explain.

In step S240, color information of the to-be-displayed object interface is configured based on the preset to-be-displayed object color mapping frame and the configuration mode, where the to-be-displayed object color mapping frame is used for configuring a mapping relationship between the color information and the to-be-displayed object information of the to-be-displayed object on a current display interface.

In a case where the configuration mode is the point configuration, the step in which the color information of the to-be-displayed object interface is determined based on the preset to-be-displayed object color mapping frame and the configuration mode includes the following steps: acquired color information that is selected in the configuration mode of the point configuration is configured as color information of a selected position of the to-be-displayed object interface.

Figure 2B:
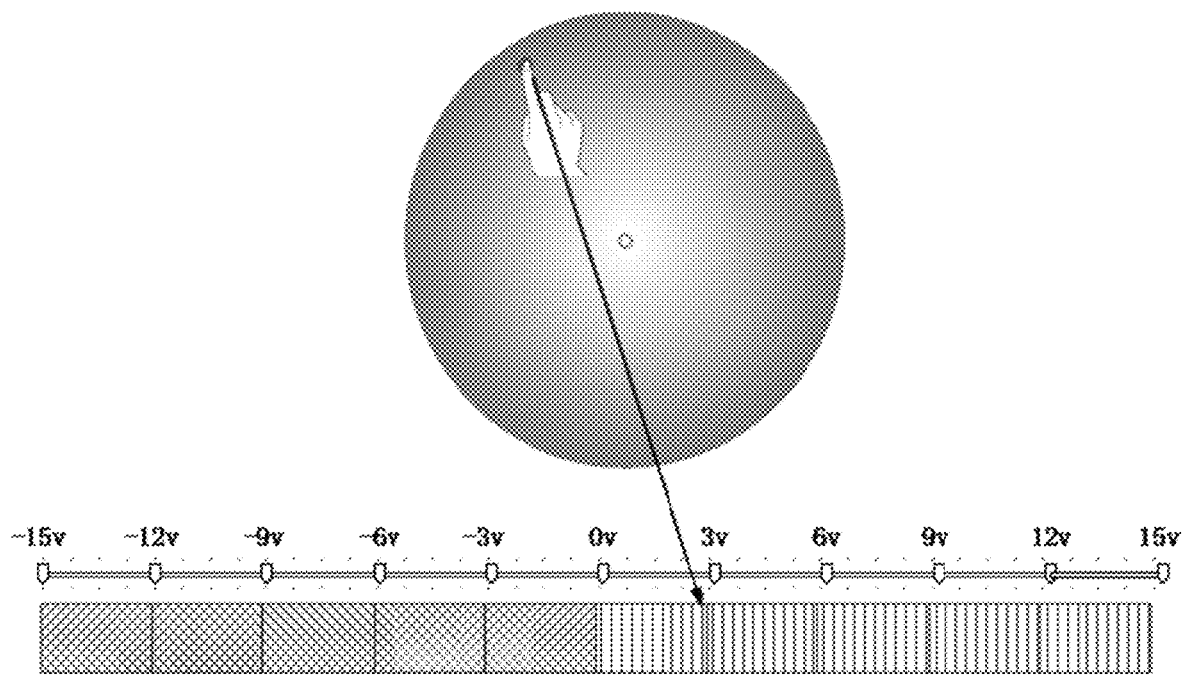
FIG. 2B is a schematic view of an exemplary point configuration for color information of a selected position of a to-be-displayed object color mapping frame according to an embodiment of the present application.

Exemplarily, using the selection interface of the color information being a color disc as an example, FIG. 2B is a schematic view of an exemplary point configuration for color information of a selected position of a to-be-displayed object color mapping frame according to an embodiment of the present application. The color information of the color disc in the selected position is acquired through the user gesture, and the color information is configured to the selected position of the to-be-displayed object color mapping frame. For this process, reference is made to FIG. 2B.

Figure 2C:
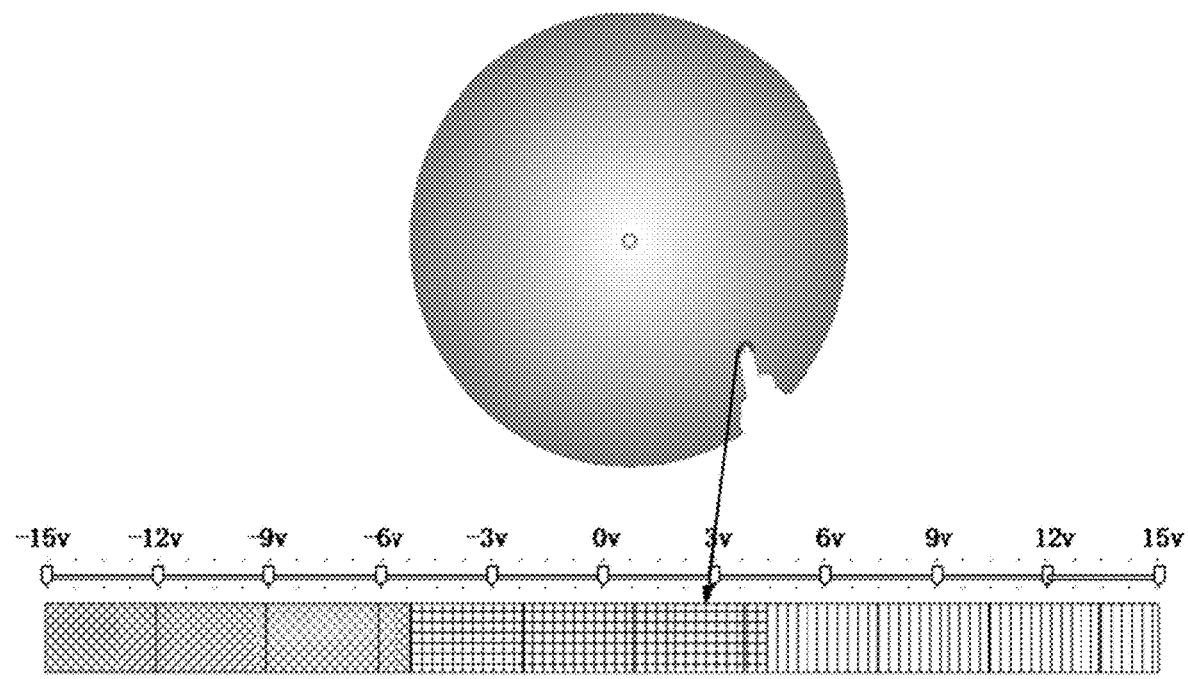
FIG. 2C is a schematic view of an exemplary point configuration for adding new color information to the existing to-be-displayed object color mapping frame according to an embodiment of the present application.

FIG. 2C is a schematic view of an exemplary point configuration for adding new color information to the existing to-be-displayed object color mapping frame according to an embodiment of the present application. It is to be noted that after the point configuration is completed, with reference to the process in FIGS. 2B to 2C, the selected color information can be dragged directly to any position of the color information in the to-be-displayed object color mapping frame, and in a case where the color information needs to be selected again, new color information needs to be added between the existing color information.

In a case where the configuration mode is the vector configuration, the step in which the color information of the to-be-displayed object interface is determined based on the preset to-be-displayed object color mapping frame and the configuration mode includes the following steps: selected continuous color information is acquired in the configuration mode of the vector configuration, and the continuous color information is configured as the color information of the to-be-displayed object interface.

Exemplarily, after it is confirmed that the configuration mode is the vector configuration, the fitting-correction needs to be performed on the track generated in the selection interface of the color information due to the continuous movement of the position during selecting the color information and the corresponding color information acquired in the selection interface of the color information on the screen of the measurement device. The manner for the fitting-correction may be considered in three cases. The manner for the fitting-correction is, after the blurring processing is performed on the track, to determine track information based on the following priority principles with prior consideration of some of the most common and practical color mappings.

Figure 2D:
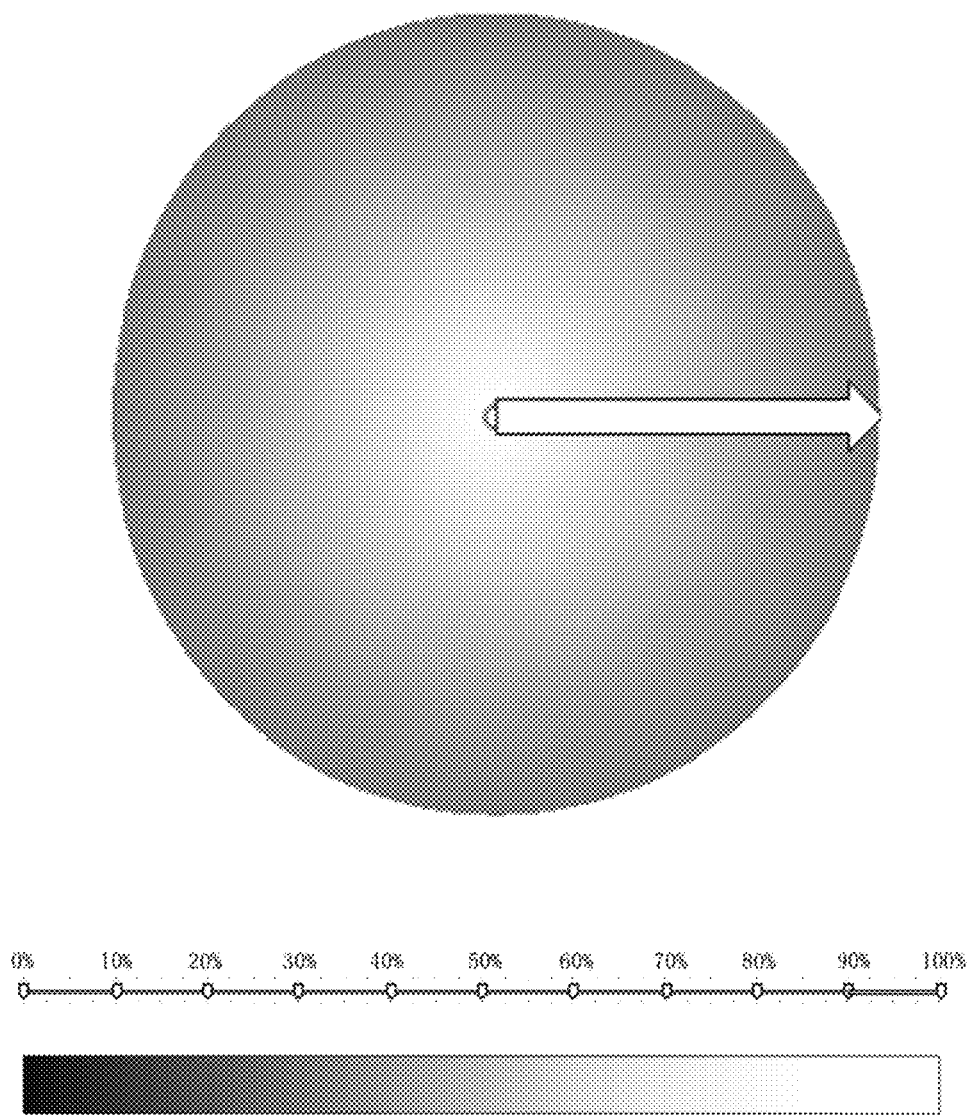
FIG. 2D is a schematic view of a vector configuration for a first priority color selection track according to an embodiment of the present application.

FIG. 2D is a schematic view of a vector configuration for a first priority color selection track according to an embodiment of the present application. With reference to FIG. 2D, using the selection interface of the color information being a color disc as an example, the first priority is a track of colors having different brightnesses in the same hue, and this track is represented on the color disc as a track with the radius of the color disc from the center point to the circumference (or from the circumference to the center point). As shown in the to-be-displayed object color mapping frame in FIG. 2D, only the brightness of colors in this frame is different, and these colors are added to the to-be-displayed object color mapping frame.

Figure 2E:
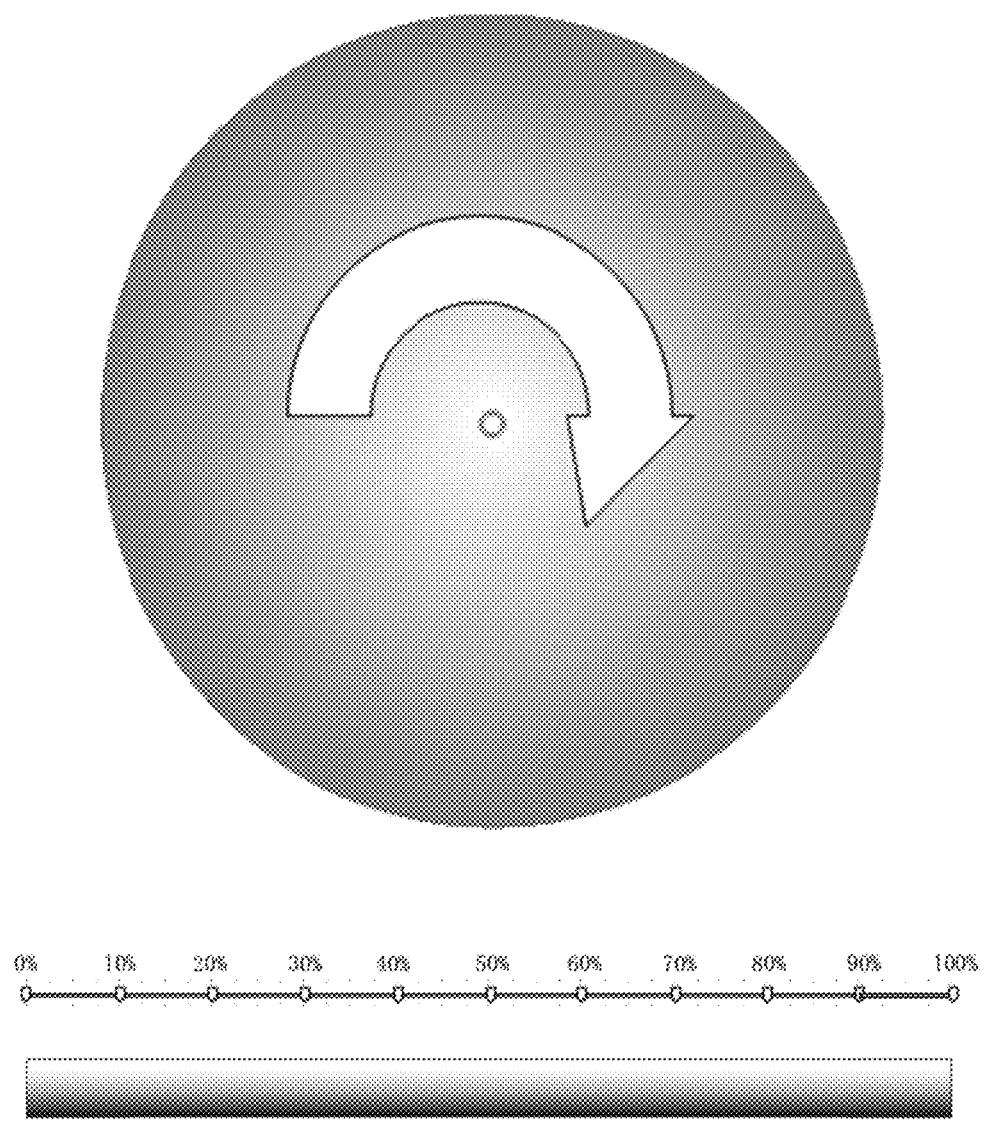
FIG. 2E is a schematic view of a vector configuration for a second priority color selection track according to an embodiment of the present application.

FIG. 2E is a schematic view of a vector configuration for a second priority color selection track according to an embodiment of the present application. With reference to FIG. 2E, using the selection interface of the color information being a color disc as an example, the second priority is a track having different colors in the same brightness, and this track is represented on the color disc as a ring having an equal radius length. As shown in the to-be-displayed object color mapping frame in FIG. 2E, only the brightness of colors in this frame is identical, and these colors are added to the to-be-displayed object color mapping frame according to their different starting positions and different ending positions.

Figure 2F:
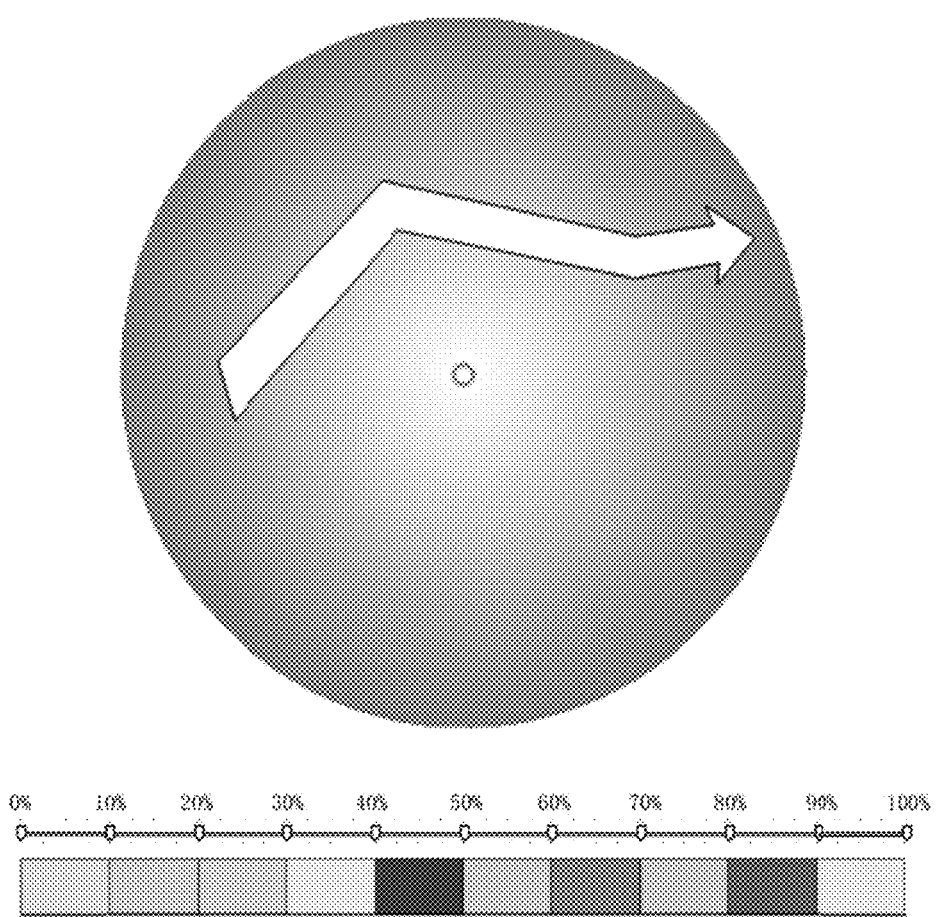
FIG. 2F is a schematic view of a vector configuration for a lowest priority color selection track according to an embodiment of the present application.

FIG. 2F is a schematic view of a vector configuration for a lowest priority color selection track according to an embodiment of the present application. With reference to FIG. 2F, using the selection interface of the color information being a color disc as an example, the lowest priority is a track freely distributed on the color disc when the determined track is not either of the above two patterns. In this case, all colors that this track passes through need to be determined, these pieces of color information are stored, and a color band is formed and then configured to the to-be-displayed object color mapping frame. As shown in the to-be-displayed object color mapping frame in FIG. 2F, colors displayed in this frame are completely different, colors in the configured color band are uniformly distributed (or may be considered to be uniformly distributed by default), and added to the to-be-displayed object color mapping frame.

It is to be noted that the color band formed after the vector configuration can be directly dragged to any position in the to-be-displayed object color mapping frame. For example, when there already are two colors in the to-be-displayed object color mapping frame after the previous configuration, if a new color band needs to be added, the new color band can be directly inserted between the two colors.

Additionally, it is to be noted that in a case where the latter color information overlays the former color information after the vector configuration, priority determination may be performed on both color information. The criteria for the priority determination may be set by those skilled in the art. The case in which the latter color information overlays the former color information refers to that in the process of one color selection, a latter track overlays a former track when the color selection track is determined by moving the mouse or sliding the finger. To avoid that one color has multiple mapping relationships with the to-be-displayed object information, the priority determination needs to be performed on the latter color and the former color.

In step S250, the to-be-displayed object information of the to-be-displayed object interface is displayed according to the configured color information.

In step S260, the mapping relationship between the to-be-displayed object information and the color information in the to-be-displayed object color mapping frame is acquired, and a mapping relationship table is generated according to the mapping relationship.

Exemplarily, after the mapping relationship between the to-be-displayed object information and the color information in the to-be-displayed object color mapping frame is determined, the color information is expressed by a numerical value manner, and the mapping relationship table corresponding to the color information and the to-be-displayed object information is generated and stored to facilitate the subsequent color configuration. The numerical value expression manner of the color information may be the common RGB representation manner and HLS (Hue, Lightness, Saturation) representation manner, which is not limited in this embodiment.

Figure 3A:
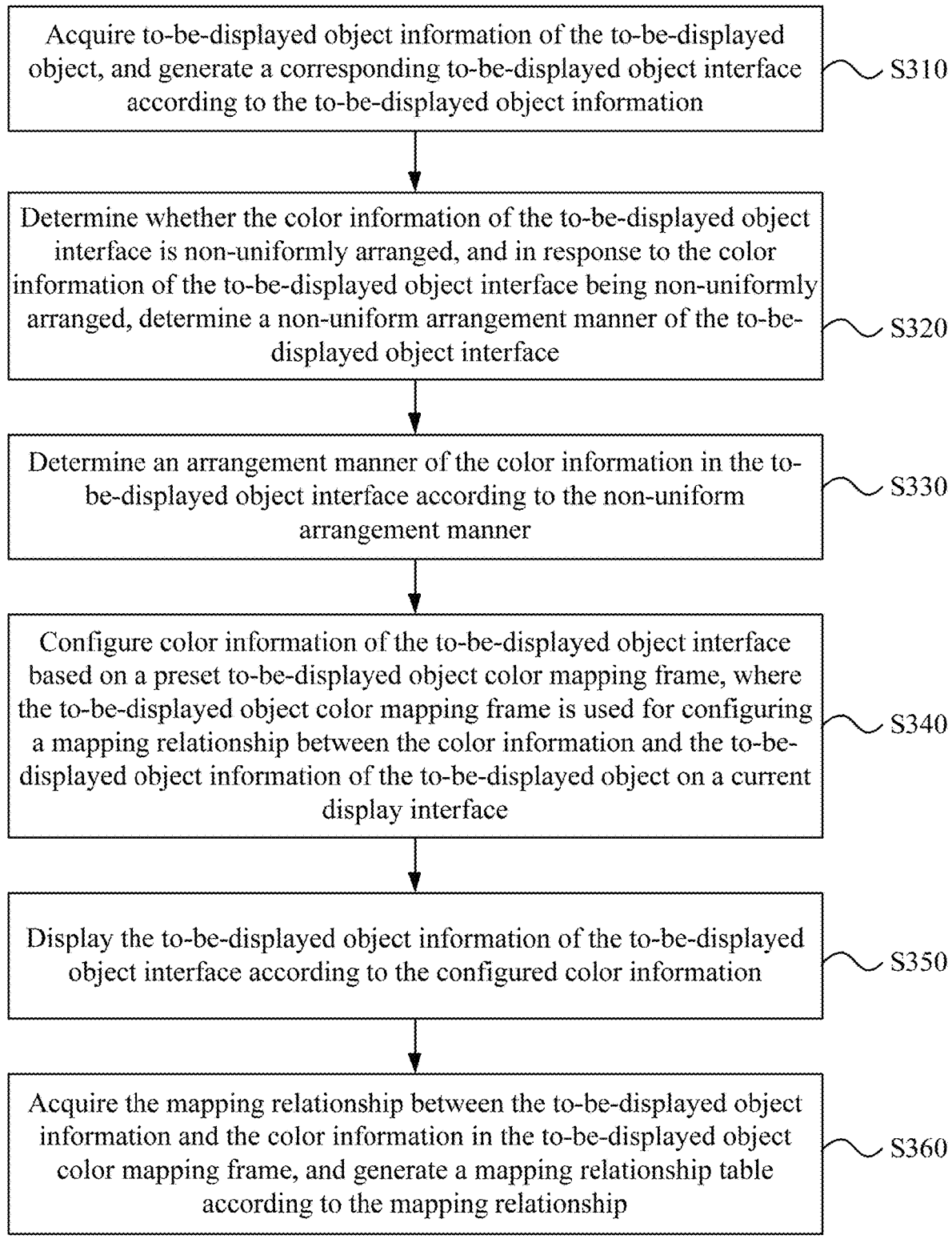
FIG. 3A is a flowchart of yet another color control method of a to-be-displayed object according to an embodiment of the present application.

In the solution of the embodiment of the present application, the selection interface of the color information having the complete color information is provided, the preset to-be-displayed object color mapping frame is provided, and the mapping relationship between the to-be-displayed object information which can be distinguished by different colors and the selected color can be displayed on the display interface of the measurement device in real-time according to the configuration mode. Therefore, the color information displayed by the to-be-displayed object can be freely selected and the mapping relationship between the selected color information and the to-be-displayed object information can be displayed in real-time in the display interface, thereby facilitating the user operation and improving the user experience. FIG. 3A is a flowchart of yet another color control method of a to-be-displayed object according to an embodiment of the present application. The technical solution of this embodiment of the present application is refined based on the preceding embodiment. The method of this embodiment includes steps S310 to S360.

In step S310, to-be-displayed object information of the to-be-displayed object is acquired, and a corresponding to-be-displayed object interface is generated according to the to-be-displayed object information.

In step S320, it is determined whether the color information of the to-be-displayed object interface is non-uniformly arranged, and in response to the color information of the to-be-displayed object interface being non-uniformly arranged, a non-uniform arrangement manner of the to-be-displayed object interface is determined.

Exemplarily, the color information of to-be-displayed object interface is uniformly arranged, that is, the color information is configured in a completely linear and uniform manner. As shown in FIG. 1C, the span of all the color information corresponds to the linear relationship of the to-be-displayed object information, which generally can be used as a default option.

It is to be noted that to completely freely perform the mapping relationship between the to-be-displayed object information and the color information, this embodiment of the present application may also support the non-uniform arrangement. There may be two options for the non-uniform arrangement, which are a recommended non-uniform arrangement manner and a manual non-uniform arrangement manner, respectively.

In step S330, an arrangement manner of the color information in the to-be-displayed object interface is determined according to the non-uniform arrangement manner.

In an embodiment, the non-uniform arrangement manner is the manual non-uniform arrangement manner.

The step in which the arrangement manner of the color information in the to-be-displayed object interface is determined according to the non-uniform arrangement manner includes one of the steps described below.

A proportional relationship of the color information in the to-be-displayed object interface is adjusted through a manual operation, and the arrangement manner of the color information in the to-be-displayed object interface is determined according to the proportional relationship of the color information.

A proportional relationship of the to-be-displayed object information in the to-be-displayed object interface is adjusted through a manual operation, and the arrangement manner of the color information in the to-be-displayed object interface is determined according to the proportional relationship of the to-be-displayed object information.

Exemplarily, the manual non-uniform arrangement manner may adjust the color information in the to-be-displayed object interface, and may also adjust the proportional relationship of the to-be-displayed object information, which is not limited in this embodiment.

The manual non-uniform arrangement manner can be completed by dragging the mouse or through the screen touch gesture. Exemplarily, using the waveform probability information of the oscilloscope as an example, the manual non-uniform arrangement manner may fix the proportion of the waveform probability information and adjust the color information in the to-be-displayed object interface, and may also fix the color information in the to-be-displayed object interface and adjust the proportion of the waveform probability information.

Figure 3B:
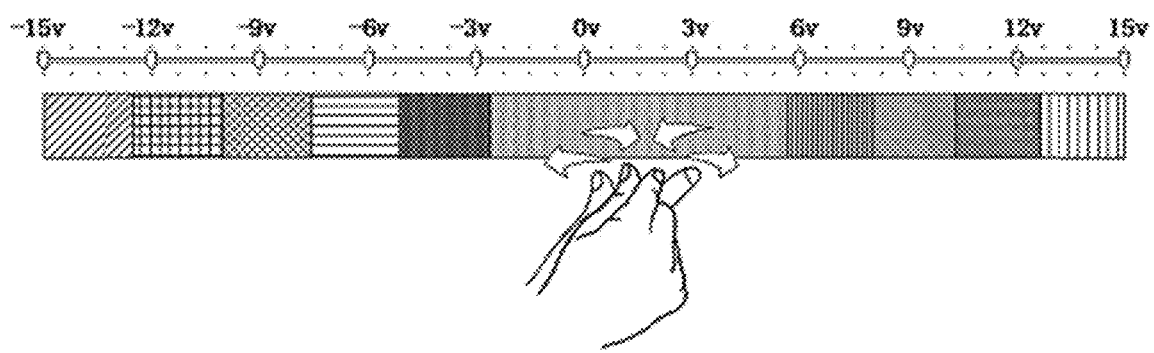
FIG. 3B is a schematic view of exemplary results of adjusting color information in a to-be-display object interface in a manual non-uniform arrangement manner according to an embodiment of the present application.

It is to be noted that the manual non-uniform arrangement manner can randomly change the proportional relationship of the color information. As shown in FIG. 3B which is a schematic view of exemplary results of adjusting color information in a to-be-display object interface in a manual non-uniform arrangement manner according to an embodiment of the present application, those skilled in the art can zoom in a range of certain color information in the to-be-displayed object interface by using a screen touch gesture while the other color ranges are still uniformly distributed, and the final non-uniform distribution result is shown in FIG. 3B.

In an embodiment, the non-uniform arrangement manner is the recommended non-uniform arrangement manner.

The step in which the arrangement manner of the color information in the to-be-displayed object interface is determined according to the non-uniform arrangement manner includes the step described below.

A proportional relationship of the color information in the to-be-displayed object interface is adjusted through the recommended non-uniform arrangement manner based on the color information and the to-be-displayed object information, and the arrangement manner of the color information in the to-be-displayed object interface is determined according to the proportional relationship of the color information.

Exemplarily, the measurement device synthetically analyzes the color information in the to-be-displayed object interface and the to-be-displayed object information and recommends an arrangement manner of the color information in the to-be-displayed object interface, i.e., the recommended non-uniform arrangement manner. The distribution manners has the color distribution rules that are familiar to those skilled in the art from the big data and also has some more conventional distribution manners.

In an embodiment, the recommended non-uniform arrangement manner includes a Gaussian arrangement manner, a Cauchy arrangement manner, or a Chi-square arrangement manner.

Exemplarily, using the recommended non-uniform arrangement manner being the Gaussian arrangement manner as an example, the Gaussian arrangement manner is implemented by a Gaussian distribution which is also known as the normal distribution. If the random variable X obeys a normal distribution with mathematical expectation $\mu$ and variance $\sigma^2$, where the normal distribution thus is denoted as N ($\mu$, $\sigma^2$), for the probability density function of the X, its position is determined by the expectation value $\mu$ of the normal distribution, and the magnitude of the distribution is determined by the standard deviation $\sigma$. In the case of $\mu=0$ and $\sigma=1$, the normal distribution is a standard normal distribution.

The density function is as follows.

$$f(x)=1/(\sigma\sqrt{2\pi})e^{(-[(x-\mu)]^2/(2\sigma^2))}$$

The numerical characteristic is as follows.

Figure 3C:
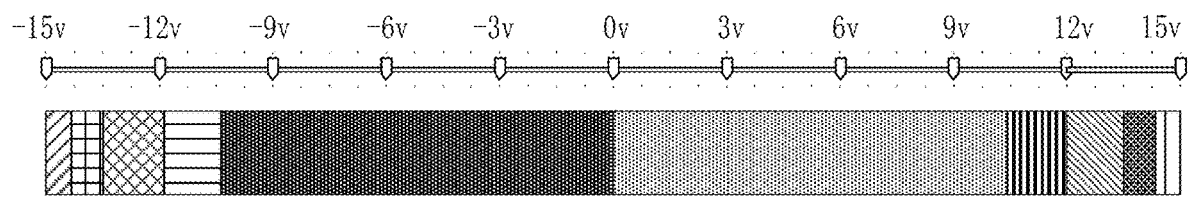
FIG. 3C is a schematic view of exemplary results of adjusting color information in a to-be-display object interface in a recommended non-uniform arrangement manner according to an embodiment of the present application.

Using an example in which there are ten colors in the to-be-displayed object interface, the changes of the mapping relationship frame before and after this non-uniform distribution manner are selected, and for these changes, specific reference is made to FIGS. 1C and 3C. FIG. 3C is a schematic view of exemplary results of adjusting color information in a to-be-display object interface in a recommended non-uniform arrangement manner according to an embodiment of the present application.

In step S340, color information of the to-be-displayed object interface is configured based on a preset to-be-displayed object color mapping frame, where the to-be-displayed object color mapping frame is used for configuring a mapping relationship between the color information and the to-be-displayed object information of the to-be-displayed object on a current display interface.

In step S350, the to-be-displayed object information of the to-be-displayed object interface is displayed according to the configured color information.

In step S360, the mapping relationship between the to-be-displayed object information and the color information in the to-be-displayed object color mapping frame is acquired, and a mapping relationship table is generated according to the mapping relationship.

In the technical solution of the embodiment of the present application, commonly-used non-uniform distribution rules are intelligently recommended, which is simple and convenient to perform, and avoids the situation in related art that the configuration requires knowledge of color composition or that the configuration is tedious and time-consuming. Therefore, this solution provides rich color configurations, giving users maximum freedom and convenience, and also provides the corresponding algorithm as support, ensuring the implementation of functions.

Figure 4:
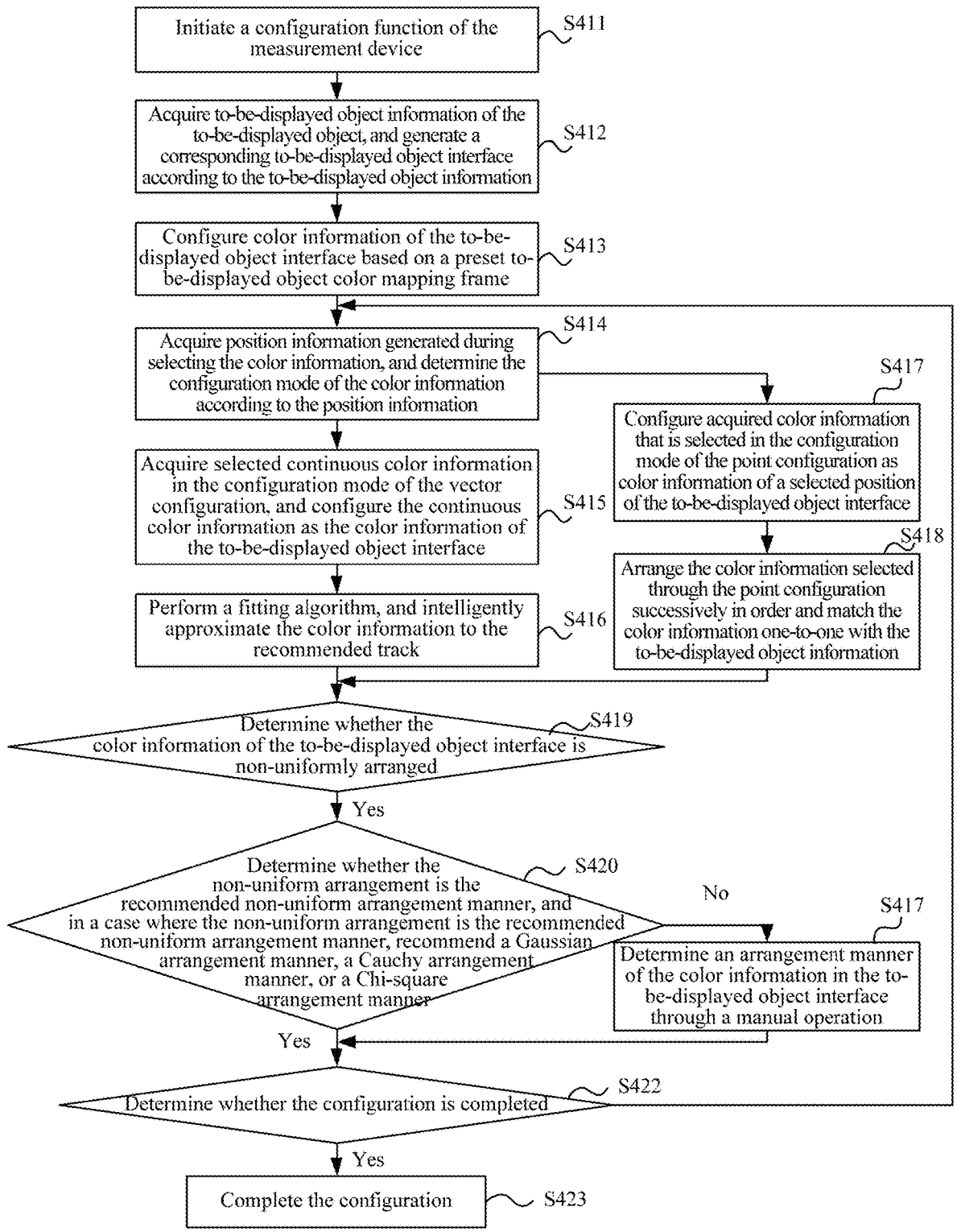
FIG. 4 is a flowchart of yet another color control method of a to-be-displayed object according to an embodiment of the present application.

FIG. 4 is a flowchart of yet another color control method of a to-be-displayed object according to an embodiment of the present application. The color control method of a to-be-displayed object includes steps S411 to S423.

In step S411, a configuration function of a measurement device is initiated.

In step S412, to-be-displayed object information of the to-be-displayed object is acquired, and a corresponding to-be-displayed object interface is generated according to the to-be-displayed object information.

In step S413, color information of the to-be-displayed object interface is configured based on a preset to-be-displayed object color mapping frame, where the to-be-displayed object color mapping frame is used for configuring a mapping relationship between the color information and the to-be-displayed object information of the to-be-displayed object on a current display interface.

In step S414, position information generated during selecting the color information is acquired, a configuration mode of the color information is determined according to the position information, and in a case where the configuration mode of the color information is a vector configuration, step S415 is performed; in a case where the configuration mode of the color information is a point configuration, step S417 is performed.

In step S415, selected continuous color information is acquired in the configuration mode of the vector configuration, and the continuous color information is configured as the color information of the to-be-displayed object interface.

In step S416, a fitting algorithm is performed, the color information is intelligently approximated to the recommended track, and step S419 is performed.

In step S417, the acquired color information that is selected in the configuration mode of the point configuration is configured as color information of a selected position of the to-be-displayed object interface.

In step S418, the color information selected through the point configuration is successively arranged in order and matches one-to-one with the to-be-displayed object information, and step S419 is performed.

In step S419, it is determined whether the color information of the to-be-displayed object interface is non-uniformly arranged; in a case where the color information of the to-be-displayed object interface is non-uniformly arranged, step S420 is performed; in a case where the color information of the to-be-displayed object interface is not non-uniformly arranged, step S422 is performed.

In step S420, it is determined whether the non-uniform arrangement is the recommended non-uniform arrangement manner; in a case where the non-uniform arrangement is the recommended non-uniform arrangement manner, a Gaussian arrangement manner, a Cauchy arrangement manner, or a Chi-square arrangement manner is recommended; in a case where the non-uniform arrangement is not the recommended non-uniform arrangement manner, step S421 is performed.

In step S421, an arrangement manner of the color information in the to-be-displayed object interface is determined through a manual operation.

In step S422, it is determined whether the configuration is completed; in a case where the configuration is completed, step S423 is performed; in a case where the configuration is not completed, step S414 is performed.

In step S423, the configuration is completed.

In the technical solution of the embodiment of the present application, the information that can be distinguished by displayed colors in the to-be-displayed object information monitored by the measurement device can be processed through a color mapping relationship. Different from the solution in the related art in which the display of the to-be-displayed object information requires performing multi-step operations, in the present application, the to-be-displayed object information can be directly perceived according to colors, and the correspondence rules between the color information and the to-be-displayed object information are very flexible without one-to-one corresponding, and the corresponding between the color information and to-be-displayed object information can be completed through the mouse, the touch screen or the gesture, thereby enabling the display more visual and more flexible. Additionally, the fullest color configuration can be implemented without increasing cost on the premise that the hardware conditions (e.g., display screen, graphics card, etc.) of the measurement device allow.

Figure 5:
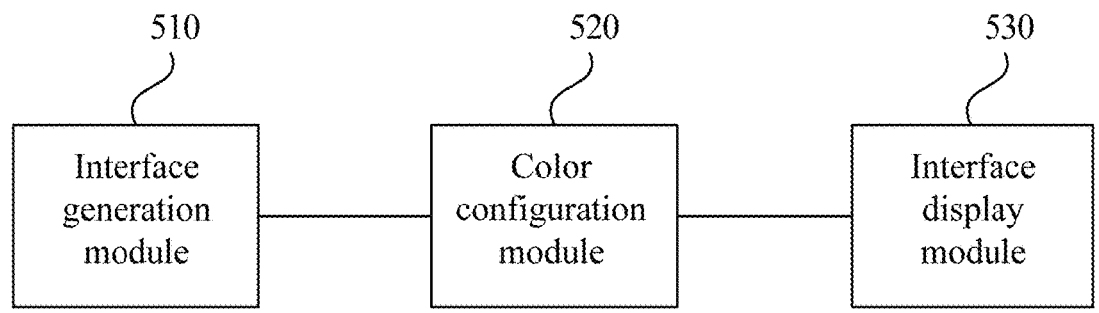
FIG. 5 is a structural view of a color control apparatus of a to-be-displayed object according to an embodiment of the present application.

FIG. 5 is a structural view of a color control apparatus of a to-be-displayed object according to an embodiment of the present application. This embodiment may be adapted to the case where the to-be-displayed object information of the measurement device and the color information displayed by the to-be-displayed object are freely set.

As shown in FIG. 5, the apparatus includes an interface generation module 510, a color configuration module 520 and an interface display module 530.

The interface generation module 510 is configured to acquire to-be-displayed object information of the to-bedisplayed object, and generate a corresponding to-be-displayed object interface according to the to-be-displayed object information.

The color configuration module 520 is configured to configure color information of the to-be-displayed object interface based on a preset to-be-displayed object color mapping frame, where the to-be-displayed object color mapping frame is used for configuring a mapping relationship between the color information and the to-be-displayed object information of the to-be-displayed object on a current display interface.

The interface display module 530 is configured to display the to-be-displayed object information of the to-be-displayed object interface according to the configured color information.

In the color control apparatus of the to-be-displayed object of this embodiment, the to-be-displayed object information of the to-be-displayed object is acquired, and the corresponding to-be-displayed object interface is generated according to the to-be-displayed object information; the color information of the to-be-displayed object interface is configured based on the preset to-be-displayed object color mapping frame, where the to-be-displayed object color mapping frame is used for configuring the mapping relationship between the color information and the to-be-displayed object information of the to-be-displayed object on the current display interface; and the to-be-displayed object information of the to-be-displayed object interface is displayed according to the configured color information. Therefore, the situation in the related art in which the display color of the to-be-displayed object of the measurement device relies on the inherent device configuration and cannot be freely set can be avoided, and thus color information displayed by the to-be-displayed object can be freely selected and the mapping relationship between the selected color information and the to-be-displayed object information can be displayed in real time in the display interface, thereby facilitating the user operation and improving the user experience.

The color configuration module 520 includes a configuration mode determination unit and a color information determination unit.

The configuration mode determination unit is configured to acquire position information generated during selecting the color information, and determine a configuration mode of the color information according to the position information.

The color information determination unit is configured to configure the color information of the to-be-displayed object interface based on the preset to-be-displayed object color mapping frame and the configuration mode.

The apparatus further includes an offset threshold determination module.

The offset threshold determination module is configured to determine an offset threshold of the configuration mode according to a selection interface of the color information and a color scale of the color information in the selection interface.

The configuration mode determination unit includes a position offset determination sub-unit and a configuration mode determination sub-unit.

The position offset determination sub-unit is configured to acquire the position information generated during selecting the color information, and determine a position offset generated during selecting the color information according to the position information.

The configuration mode determination sub-unit is configured to determine the configuration mode of the color information according to the position offset and the offset threshold.

The configuration mode determination sub-unit is configured to: determine whether the position offset is less than the offset threshold, and in response to the position offset being less than the offset threshold, determine that the configuration mode is a point configuration.

The color information determination unit is configured to: configure acquired color information that is selected in the configuration mode of the point configuration as color information of a selected position of the to-be-displayed object interface.

The configuration mode determination sub-unit is configured to: determine whether the position offset is greater than the offset threshold, and in response to the position offset being greater than the offset threshold, determine that the configuration mode is a vector configuration.

The color information determination unit is configured to: acquire selected continuous color information in the configuration mode of the vector configuration, and configure the continuous color information as the color information of the to-be-displayed object interface.

The configuration mode determination sub-unit is configured to: determine whether the position offset is equal to the offset threshold, and in response to the position offset being equal to the offset threshold, determine that the configuration mode is the point configuration or the vector configuration.

In a case where the configuration mode is the point configuration, the step in which the color information of the to-be-displayed object interface is configured based on the preset to-be-displayed object color mapping frame and the configuration mode includes the step described below.

Acquired color information that is selected in the configuration mode of the point configuration is configured as color information of a selected position of the to-be-displayed object interface.

In a case where the configuration mode is the vector configuration, the step in which the color information of the to-be-displayed object interface is configured based on the preset to-be-displayed object color mapping frame and the configuration mode includes the step described below.

Selected continuous color information in the configuration mode of the vector configuration is acquired, and the continuous color information is configured as the color information of the to-be-displayed object interface.

The apparatus further includes a non-uniform arrangement manner determination module and a color information arrangement manner determination module.

The non-uniform arrangement manner determination module is configured to determine whether the color information of the to-be-displayed object interface is non-uniformly arranged, and in response to the color information of the to-be-displayed object interface being non-uniformly arranged, determine a non-uniform arrangement manner of the to-be-displayed object interface.

The color information arrangement manner determination module is configured to determine the arrangement manner of the color information in the to-be-displayed object interface according to the non-uniform arrangement manner.

The non-uniform arrangement manner is a manual non-uniform arrangement manner.

The step in which the arrangement manner of the color information in the to-be-displayed object interface is determined according to the non-uniform arrangement manner includes one of the steps described below.

A proportional relationship of the color information in the to-be-displayed object interface is adjusted through a manual operation, and the arrangement manner of the color information in the to-be-displayed object interface is determined according to the proportional relationship of the color information.

A proportional relationship of the to-be-displayed object information in the to-be-displayed object interface is adjusted through a manual operation, and the arrangement manner of the color information in the to-be-displayed object interface is determined according to the proportional relationship of the to-be-displayed object information.

The non-uniform arrangement manner is a recommended non-uniform arrangement manner.

The step in which the arrangement manner of the color information in the to-be-displayed object interface is determined according to the non-uniform arrangement manner includes the step described below.

A proportional relationship of the color information in the to-be-displayed object interface is adjusted through the recommended non-uniform arrangement manner based on the color information and the to-be-displayed object information, and the arrangement manner of the color information in the to-be-displayed object interface is determined according to the proportional relationship of the color information.

The recommended non-uniform arrangement manner includes a Gaussian arrangement manner, a Cauchy arrangement manner, or a Chi-square arrangement manner.

The apparatus further includes a mapping relationship table generation module.

The mapping relationship table generation module is configured to acquire the mapping relationship between the to-be-displayed object information and the color information in the to-be-displayed object color mapping frame, and generate a mapping relationship table according to the mapping relationship.

The color control apparatus of the to-be-displayed object provided by the preceding embodiments can execute the color control method of the to-be-displayed object provided by any embodiment of the present application.

Figure 6:
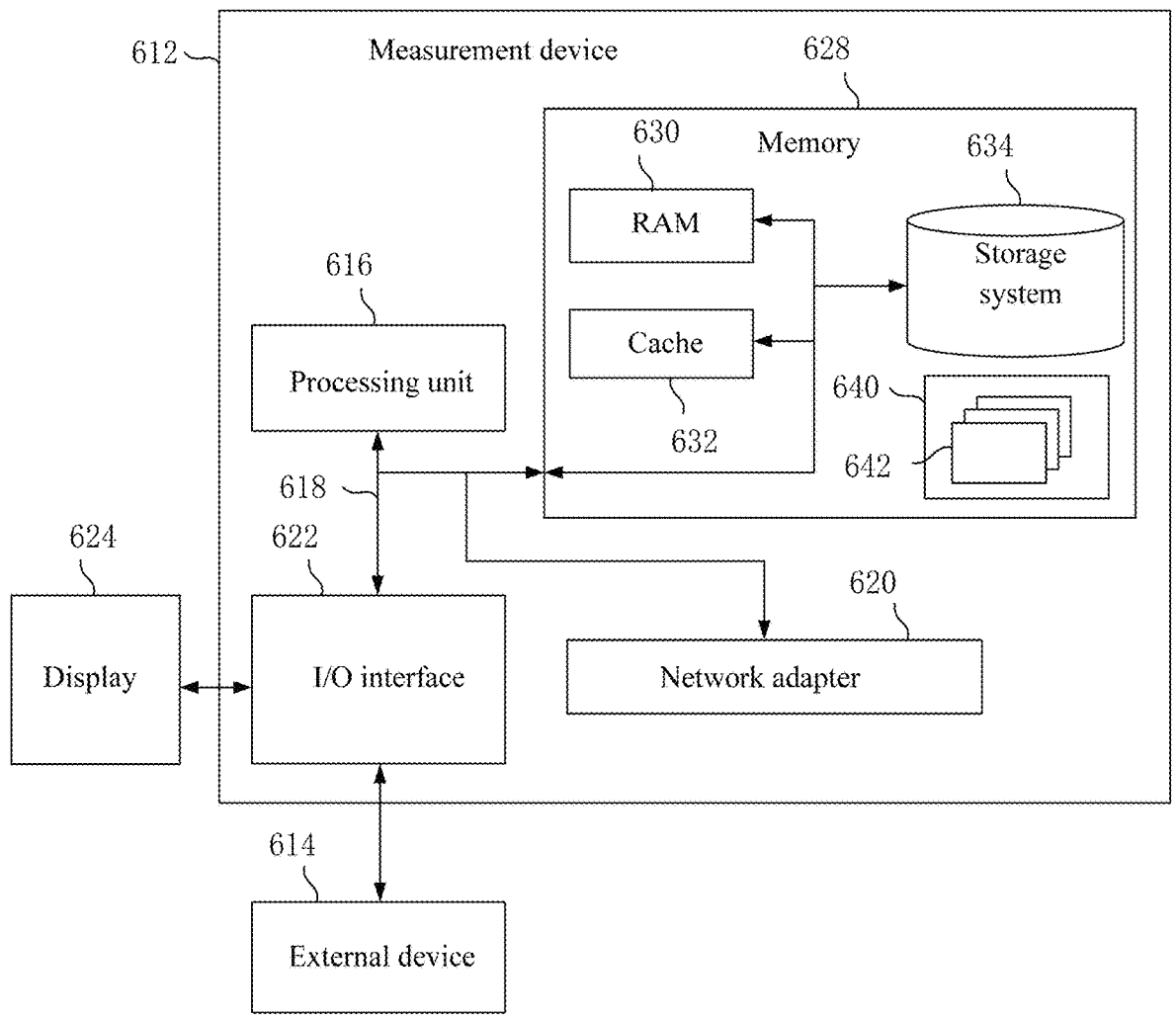
FIG. 6 is a hardware structural view of a measurement device according to an embodiment of the present application.

FIG. 6 is a structural view of a measurement device according to an embodiment of the present application. FIG. 6 shows a block diagram of an exemplary measurement device 612 adapted to implement the implementation modes of the present application. The measurement device 612 shown in FIG. 6 is merely an example and is not intended to limit the function and use scope of embodiments of the present application.

As shown in FIG. 6, the measurement device 612 may be represented in a form of a general-purpose computer device. Components of the measurement device 612 may include, but is not limited to, at least one processor or processing unit 616, a system memory 628, and a bus 618 connecting different system components (including the system memory 628 and the at least one processing unit 616).

The bus 618 represents at least one of several types of bus structures, including a memory bus or memory controller, a peripheral bus, an accelerated graphics port, a processor or local bus using any of a variety of bus architectures. For example, these architectures include, but are not limited to, an industrial standard architecture (ISA) bus, a micro channel architecture (MAC) bus, an enhanced ISA bus, a video electronics standards association (VESA) local bus and a peripheral component interconnect (PCI) bus.

The measurement device 612 typically includes multiple types of computer system readable media. These media may be available media that can be accessed by the measurement device 612, including volatile and non-volatile media, and removable and non-removable media.

The system memory 628 may include computer system readable media in the form of volatile memory, such as random access memory (RAM) 630 and/or a cache 632. The measurement device 612 may include other removable/non-removable, volatile/non-volatile computer system storage media. By way of example only, the storage system 634 may be configured to read from and write to non-removable, non-volatile magnetic media (not shown in FIG. 6, commonly referred to as a "hard disk drive"). Although not shown in FIG. 6, the storage system 634 can provide a magnetic disk driver for performing reading and writing on a removable non-volatile magnetic disk (for example, a "floppy disk"), and an optical disk driver for performing reading and writing on a removable non-volatile optical disk (e.g., a compact disc read-only memory (CD-ROM), a digital video disc-read only memory (DVD-ROM) or other optical media). In these cases, each driver may be connected to the bus 618 via at least one data media interface. The memory 628 may include at least one program product having a group of program modules (e.g., at least one program module). These program modules are configured to perform functions of various embodiments of the present application.

A program/utility 640 having a group of program modules 642 (at least one program module 642) may be stored in such as the memory 628. Such program modules 642 include, but are not limited to, an operating system, at least one application, other program modules and program data. Each or a certain combination of these examples may include implementation of a network environment. The program modules 642 generally perform functions and/or methods in the embodiments of the present application.

The measurement device 612 may also communicate with at least one external device 614 (e.g., a keyboard, a pointing terminal, a display 624, etc.). The measurement device 612 may also communicate with at least one device that enables a user to interact with the measurement device 612, and/or communicate with any device (e.g., a network card, a modem, etc.) that enables the measurement device 12 to communicate with at least one of other computing devices. Such communication may be performed through an input/output (I/O) interface 622. Moreover, the measurement device 612 may communicate with at least one network (e.g., a local area networks (LAN), a wide area network (WAN) and/or a public network, for example, the Internet) through a network adapter 620. As shown in FIG. 6, the network adapter 620 communicates with other modules of the measurement device 612 via the bus 618. It is to be understood that although not shown in FIG. 6, other hardware and/or software modules may be used in conjunction with the measurement device 612. The other hardware and/or software modules include, but are not limited to, microcode, a device driver, a redundant processing unit, an external disk drive array, a redundant arrays of independent disks (RAID) system, a tape driver, a data backup storage system and the like.

The at least one processing unit 616 executes a program stored in the system memory 628 to perform various functional applications and data processing, for example, to implement the color control method of the to-be-displayed object provided by the embodiments of the present application. The color control method of the to-be-displayed object includes the steps described below.

To-be-displayed object information of the to-be-displayed object is acquired, and a corresponding to-be-displayed object interface is generated according to the to-be-displayed object information.

Color information of the to-be-displayed object interface is configured based on a preset to-be-displayed object color mapping frame, where the to-be-displayed object color mapping frame is used for configuring a mapping relationship between the color information and the to-be-displayed object information of the to-be-displayed object on a current display interface.

The to-be-displayed object information of the to-be-displayed object interface is displayed according to the configured color information.

Of course, it is to be understood by those skilled in the art that the processor can also implement technical solutions of the color control method of the to-be-displayed object provided by any embodiment of the present application.

An embodiment of the present application further provides a computer-readable storage medium. The computer-readable storage medium is configured to store a computer program, where the computer program, when executed by a processor, implements the color control method of the to-be-displayed object provided by the embodiments of the present application. The color control method of the to-be-displayed object includes the steps described below.

To-be-displayed object information of the to-be-displayed object is acquired, and a corresponding to-be-displayed object interface is generated according to the to-be-displayed object information.

Color information of the to-be-displayed object interface is configured based on a preset to-be-displayed object color mapping frame, where the to-be-displayed object color mapping frame is used for configuring a mapping relationship between the color information and the to-be-displayed object information of the to-be-displayed object on a current display interface.

The to-be-displayed object information of the to-be-displayed object interface is displayed according to the configured color information.

Of course, for the computer-readable storage medium provided by the embodiment of the present application, the computer program stored in the computer-readable storage medium may implement not only the above method operations but also related operations in the color control method of the to-be-displayed object provided by any embodiment of the present application.

The computer storage medium in the embodiment of the present application may employ any combination of at least one computer-readable medium. The computer-readable medium may be a computer-readable signal medium or a computer-readable storage medium. The computer-readable storage medium may be, but is not limited to, an electronic, magnetic, optical, electromagnetic, infrared, or semiconductor system, apparatus, or device, or any combination thereof. More specific examples (a non-exhaustive list) of the computer-readable storage medium include: an electrical connection having at least one wire, a portable computer magnetic disk, a hard disk, an RAM, a read-only memory (ROM), an erasable programmable read-only memory (EPROM) (or flash memory), an optical fiber, a portable CD-ROM, an optical memory device, a magnetic memory device, or any suitable combination thereof. In this document, the computer-readable storage medium may be any tangible medium including or storing a program. The program may be used by or used in conjunction with an instruction execution system, apparatus or device.

The computer-readable signal medium may include a data signal propagated in a baseband or as part of a carrier, where the data signal carries computer-readable program codes. Such propagated data signal may be in multiple forms including, but not limited to, an electromagnetic signal, an optical signal or any suitable combination thereof. The computer-readable signal medium may further be any computer-readable medium other than a computer-readable storage medium. The computer-readable medium may send, propagate or transmit the program used by or used in conjunction with the instruction execution system, apparatus or device.

Program codes contained in the computer-readable medium may be transmitted using any appropriate medium, including but not limited to wireless, wireline, optical fiber cable, radio frequency (RF), etc., or any appropriate combinations thereof.

Computer program codes for performing the operations of the present application may be written in one or more programming languages or a combination thereof, and the programming languages includes object-oriented programming languages such as Java, Smalltalk, C++ and further includes conventional procedural programming languages such as "C" programming language or similar programming languages. The program codes may be executed entirely on a user computer, partly on the user computer, as a stand-alone software package, partly on the user computer and partly on a remote computer, or entirely on the remote computer or server. In the scenario involving the remote computer, the remote computer may be connected to the user's computer through any type of network, including an LAN or WAN, or the connection may be made to an external computer (e.g., through the Internet using an Internet service provider).

What is claimed is:

1. A color control method of a to-be-displayed object, comprising:

acquiring to-be-displayed object information of the to-be-displayed object, and generating a corresponding to-be-displayed object interface according to the to-be-displayed object information;

configuring color information of the to-be-displayed object interface based on a preset to-be-displayed object color mapping frame, wherein the to-be-displayed object color mapping frame is used for configuring a mapping relationship between the color information and the to-be-displayed object information of the to-be-displayed object on a current display interface; and displaying the to-be-displayed object information of the to-be-displayed object interface according to the configured color information;

wherein configuring the color information of the to-be-displayed object interface based on the preset to-be-displayed object color mapping frame comprises:

acquiring position information generated during selecting the color information, and determining a configuration mode of the color information according to the position information; and configuring the color information of the to-be-displayed object interface based on the preset to-be-displayed object color mapping frame and the configuration mode.

2. The method of claim 1, before determining the configuration mode of the color information according to the position information, further comprising:

determining an offset threshold of the configuration mode according to a selection interface of the color information and a color scale of the color information in the selection interface.

3. The method of claim 2, wherein acquiring the position information generated during selecting the color information, and determining the configuration mode of the color information according to the position information comprises:
acquiring the position information generated during selecting the color information, and determining, according to the position information, a position offset generated during selecting the color information; and
determining the configuration mode of the color information according to the position offset and the offset threshold.

4. The method of claim 3, wherein determining the configuration mode of the color information according to the position offset and the offset threshold comprises:
determining whether the position offset is less than the offset threshold, and in response to the position offset less than the offset threshold, determining that the configuration mode is a point configuration; and
wherein configuring the color information of the to-be-displayed object interface based on the preset to-be-displayed object color mapping frame and the configuration mode comprises:
configuring acquired color information that is selected in the configuration mode of the point configuration as color information of a selected position of the to-be-displayed object interface.

5. The method of claim 3, wherein determining the configuration mode of the color information according to the position offset and the offset threshold comprises:
determining whether the position offset is greater than the offset threshold, and in response to the position offset greater than the offset threshold, determining that the configuration mode is a vector configuration; and
wherein configuring the color information of the to-be-displayed object interface based on the preset to-be-displayed object color mapping frame and the configuration mode comprises:
acquiring selected continuous color information in the configuration mode of the vector configuration, and configuring the continuous color information as the color information of the to-be-displayed object interface.

6. The method of claim 3, wherein determining the configuration mode of the color information according to the position offset and the offset threshold comprises:
determining whether the position offset is equal to the offset threshold, and in response to the position offset equal to the offset threshold, determining that the configuration mode is a point configuration or a vector configuration;
wherein, in a case where the configuration mode is the point configuration, configuring the color information of the to-be-displayed object interface based on the preset to-be-displayed object color mapping frame and the configuration mode comprises: configuring acquired color information that is selected in the configuration mode of the point configuration as color information of a selected position of the to-be-displayed object interface;
wherein, in a case where the configuration mode is the vector configuration, configuring the color information of the to-be-displayed object interface based on the preset to-be-displayed object color mapping frame and the configuration mode comprises: acquiring selected continuous color information in the configuration mode of the vector configuration, and configuring the continuous color information as the color information of the to-be-displayed object interface.

7. The method of claim 1, before configuring the color information of the to-be-displayed object interface based on the preset to-be-displayed object color mapping frame, further comprising:
determining whether the color information of the to-be-displayed object interface is non-uniformly arranged, and in response to the color information of the to-be-displayed object interface being non-uniformly arranged, determining that a non-uniform arrangement manner is adopted for the to-be-displayed object interface; and
determining an arrangement manner of the color information in the to-be-displayed object interface according to the non-uniform arrangement manner.

8. The method of claim 7, wherein the non-uniform arrangement manner is a manual non-uniform arrangement manner; and
wherein determining the arrangement manner of the color information in the to-be-displayed object interface according to the non-uniform arrangement manner comprises:
adjusting a proportional relationship of the color information in the to-be-displayed object interface through a manual operation, and determining the arrangement manner of the color information in the to-be-displayed object interface according to the proportional relationship of the color information; or
adjusting a proportional relationship of the to-be-displayed object information in the to-be-displayed object interface through a manual operation, and determining the arrangement manner of the color information in the to-be-displayed object interface according to the proportional relationship of the to-be-displayed object information.

9. The method of claim 7, wherein the non-uniform arrangement manner is a recommended non-uniform arrangement manner; and
wherein determining the arrangement manner of the color information in the to-be-displayed object interface according to the non-uniform arrangement manner comprises:
adjusting a proportional relationship of the color information in the to-be-displayed object interface through the recommended non-uniform arrangement manner based on the color information and the to-be-displayed object information, and determining the arrangement manner of the color information in the to-be-displayed object interface according to the proportional relationship of the color information.

10. The method of claim 9, wherein the recommended non-uniform arrangement manner comprises a Gaussian arrangement manner, a Cauchy arrangement manner, or a Chi-square arrangement manner.

11. The method of claim 1, further comprising:
acquiring the mapping relationship between the to-be-displayed object information and the color information in the to-be-displayed object color mapping frame, and generating a mapping relationship table according to the mapping relationship.

* * * * *